US009460788B2

(12) United States Patent
Nazarian et al.

(10) Patent No.: US 9,460,788 B2
(45) Date of Patent: Oct. 4, 2016

(54) NON-VOLATILE MEMORY CELL UTILIZING VOLATILE SWITCHING TWO TERMINAL DEVICE AND A MOS TRANSISTOR

(71) Applicant: Crossbar, Inc., Santa Clara, CA (US)

(72) Inventors: Hagop Nazarian, San Jose, CA (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/717,185

(22) Filed: May 20, 2015

(65) Prior Publication Data

US 2016/0012886 A1    Jan. 14, 2016

Related U.S. Application Data

(60) Provisional application No. 62/022,594, filed on Jul. 9, 2014.

(51) Int. Cl.
| | |
|---|---|
| *G11C 11/00* | (2006.01) |
| *G11C 13/00* | (2006.01) |
| *G11C 14/00* | (2006.01) |

(52) U.S. Cl.
CPC ........... *G11C 13/004* (2013.01); *G11C 13/003* (2013.01); *G11C 13/0069* (2013.01); *G11C 13/0097* (2013.01); *G11C 14/00* (2013.01); *G11C 14/0045* (2013.01); *G11C 2213/53* (2013.01); *G11C 2213/79* (2013.01)

(58) Field of Classification Search
CPC ............ G11C 13/004; G11C 13/0097; G11C 13/0069
USPC ............. 365/148, 185.18, 145, 149, 189.011
See application file for complete search history.

(56) References Cited

U.S. PATENT DOCUMENTS

| | | |
|---|---|---|
| 6,849,891 B1 | 2/2005 | Hsu et al. |
| 6,855,975 B2 | 2/2005 | Gilton |

(Continued)

FOREIGN PATENT DOCUMENTS

| | | |
|---|---|---|
| CN | 101501850 A | 8/2009 |
| JP | 201123645 A | 2/2011 |
| WO | 2011005266 A1 | 1/2011 |

OTHER PUBLICATIONS

Di-lice Action dated Dec. 6, 2013 for U.S. Appl. No. 13/960,735, 19 pages.

(Continued)

*Primary Examiner* — Richard Elms
*Assistant Examiner* — Mohammed A Bashar
(74) *Attorney, Agent, or Firm* — Amin, Turocy & Watson, LLP

(57) ABSTRACT

A non-volatile memory device is provided that uses one or more volatile elements. In some embodiments, the non-volatile memory device can include a resistive two-terminal selector that can be in a low resistive state or a high resistive state depending on the voltage being applied. A MOS ("metal-oxide-semiconductor") transistor in addition to a capacitor or transistor acting as a capacitor can also be included. A first terminal of the capacitor can be connected to a voltage source, and the second terminal of the capacitor can be connected to the selector device. A floating gate of an NMOS transistor can be connected to the other side of the selector device, and a second NMOS transistor can be connected in series with the first NMOS transistor.

27 Claims, 9 Drawing Sheets

(56) References Cited

U.S. PATENT DOCUMENTS

| | | |
|---|---|---|
| 7,176,530 B1 | 2/2007 | Bulucea et al. |
| 7,187,577 B1 | 3/2007 | Wang et al. |
| 7,274,064 B2 | 9/2007 | Bertin et al. |
| 7,368,752 B2 | 5/2008 | Luyken et al. |
| 7,579,612 B2 | 8/2009 | Tang et al. |
| 7,704,788 B2 | 4/2010 | Youn et al. |
| 7,786,464 B2 | 8/2010 | Nirschl et al. |
| 7,791,060 B2 | 9/2010 | Aochi et al. |
| 7,829,875 B2 | 11/2010 | Scheuerlein |
| 7,830,698 B2 | 11/2010 | Chen et al. |
| 7,859,884 B2 | 12/2010 | Scheuerlein |
| 7,881,097 B2 | 2/2011 | Hosomi et al. |
| 7,897,953 B2 | 3/2011 | Liu |
| 7,920,412 B2 | 4/2011 | Hosotani et al. |
| 7,924,138 B2 | 4/2011 | Kinoshita et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,067,815 B2 | 11/2011 | Chien et al. |
| 8,102,698 B2 | 1/2012 | Scheuerlein |
| 8,164,948 B2 | 4/2012 | Kattie et al. |
| 8,218,350 B2 | 7/2012 | Kozicki |
| 8,320,160 B2 | 11/2012 | Nazarian |
| 8,351,241 B2 | 1/2013 | Lu et al. |
| 8,369,139 B2 | 2/2013 | Liu et al. |
| 8,411,485 B2 | 4/2013 | Nazarian et al. |
| 8,502,185 B2 | 8/2013 | Lu et al. |
| 8,659,933 B2 | 2/2014 | Jo |
| 8,767,441 B2 | 7/2014 | Lu et al. |
| 2004/0170040 A1 | 9/2004 | Rinerson et al. |
| 2006/0231910 A1 | 10/2006 | Hsieh et al. |
| 2008/0192531 A1 | 8/2008 | Tamura et al. |
| 2009/0014707 A1 | 1/2009 | Lu et al. |
| 2009/0231910 A1 | 9/2009 | Liu et al. |
| 2010/0124093 A1* | 5/2010 | Shiga et al. ............... 365/145 |
| 2010/0157656 A1 | 6/2010 | Tsuchida |
| 2010/0176367 A1 | 7/2010 | Liu |
| 2010/0237314 A1 | 9/2010 | Tsukamoto et al. |
| 2010/0243983 A1 | 9/2010 | Chiang et al. |
| 2011/0033967 A1 | 2/2011 | Lutz et al. |
| 2011/0089391 A1 | 4/2011 | Mihnea et al. |
| 2011/0310656 A1 | 12/2011 | Kreupl et al. |
| 2011/0317470 A1 | 12/2011 | Lu et al. |
| 2012/0007035 A1 | 1/2012 | Jo et al. |
| 2012/0044751 A1 | 2/2012 | Wang et al. |
| 2012/0122290 A1 | 5/2012 | Nagashima |
| 2012/0176831 A1 | 7/2012 | Xiao et al. |
| 2012/0187410 A1 | 7/2012 | Yamazaki et al. |
| 2012/0236650 A1* | 9/2012 | Nazarian ............... 365/185.18 |
| 2012/0305879 A1 | 12/2012 | Lu et al. |
| 2012/0314472 A1 | 12/2012 | Chung |
| 2013/0264534 A1 | 10/2013 | Hwang et al. |
| 2014/0231740 A1 | 8/2014 | Ohba |
| 2014/0284544 A1 | 9/2014 | Miyagawa et al. |
| 2014/0292365 A1 | 10/2014 | Said |
| 2015/0070966 A1 | 3/2015 | Bandyopadhyay et al. |

OTHER PUBLICATIONS

Office Action dated Mar. 17, 2015 for U.S. Appl. No. 14/573,770, 19 pages.
Wouters, "Scaling challenges for 2-terminal select devices," ITRS ERD Selector Workshop, Apr. 2012, 41 pages, IMEC, Noorderwijk, NL.
Office Action dated May 27, 2015 for U.S. Appl. No. 14/588,185, 23 pages.
Office Action dated Jun. 19, 2012 for U.S. Appl. No. 13/149,757, 11 pages.
International Search Report and Written Opinion for PCT Application No. PCT/US2015/17370 mailed Jul. 13, 2015, 17 pages.
Office Action dated Oct. 3, 2013 for U.S. Appl. No. 13/921,157, 10 pages.
International Search Report and Written Opinion for PCT Application No. PCT/US2012/040232 mailed Feb. 26, 2013, 9 pages.
Office Action dated May 7, 2013 for U.S. Appl. No. 13/585,759, 12 pages.
Office Action dated May 23, 2013 for U.S. Appl. No. 13/592,224, 9 pages.
Notice of Allowance dated Sep. 19, 2013 for U.S. Appl. No. 13/585,759, 9 pages.
Office Action dated Dec. 6, 2013 for U.S. Appl. No. 13/960,735, 10 pages.
International Search Report and Written Opinion for PCT Application No. PCT/US2013/054976 mailed Dec. 16, 2013, 9 pages.
Notice of Allowance dated Jul. 22, 2015 for U.S. Appl. No. 14/612,025, 11 pages.
Chinese Office Action (with English translation) dated Nov. 23, 2015 for Chinese Patent Application No. 201280027066.9, 12 pages.
Dffice Action dated Jul. 6, 2016 for U.S. Appl. No. 14/726,071, 25 Pages.
Ex Parte Quayle Office Action dated Aug. 18, 2016 for U.S. Appl. No. 14/795,105, 13 Pages.

* cited by examiner

NON-VOLATILE MEMORY CELL UTILIZING VOLATILE SWITCHING TWO TERMINAL DEVICE AND A MOS TRANSISTOR

REFERENCE TO RELATED APPLICATIONS

The present application for patent claims the benefit of priority to U.S. Provisional Patent Application Ser. No. 62/022,594 entitled "Non-Volatile Memory Cell Utilizing Volatile Switching Two-Terminal Device and a MOS Transistor" and filed Jul. 9, 2014, the disclosure of which is incorporated herein by reference in its entirety and for all purposes. The present application for patent is related to U.S. Non-Provisional patent application Ser. No. 14/588, 185, entitled "Selector Device for Two-Terminal Memory" and filed Dec. 31, 2014, the entirety of which is incorporated herein for all purposes. U.S. Non-Provisional application Ser. No. 11/875,541 filed Oct. 19, 2007 and application Ser. No. 12/575,921 filed Oct. 8, 2009, are also incorporated by reference herein in their respective entireties and for all purposes.

TECHNICAL FIELD

The subject disclosure relates generally to non-volatile memory, and as one illustrative example, a non-volatile memory cell utilizing a volatile resistive switching device and MOS transistor.

BACKGROUND

The inventor(s) of the present disclosure have proposed models of two-terminal memory devices that he expects to operate as viable alternatives to various memory cell technologies, such as metal-oxide semiconductor (MOS) type memory cells employed for electronic storage of digital information. Models of memory cells using two-terminal memory such as resistive-switching memory devices among others, are believed by the inventor(s) to provide some potential advantages over purely non-volatile FLASH MOS type transistors, including smaller die size, higher memory density, faster switching (e.g., from a relatively conductive state to a relatively non-conductive state, or vice versa), good data reliability, low manufacturing cost, fab-compatible processes, and other advantages, for example.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments disclosed herein provide a method for operating a memory circuit comprising a capacitor structure, a selector device, and a MOS transistor, wherein the capacitor comprises a first terminal and a second terminal, the selector device comprises a first electrode connected to the second terminal, and a second electrode connected to a gate of the MOS transistor and the MOS transistor also includes a source and a drain. The method can comprise applying a first positive voltage in a first positive voltage range below a predetermined voltage to the first terminal of the capacitor structure, wherein the selector device is in a high resistance state in the first positive voltage range. The method can also comprise applying a second positive voltage in a second positive voltage range above the predetermined voltage to the first terminal of the capacitor structure, wherein the selector device is in a low resistance state and a first charge accumulates on the gate of the MOS transistor in response to the applying the second positive voltage in the second positive voltage range. The method can also comprise removing the second positive voltage from the first terminal of the capacitor and maintaining a portion of the first charge on the gate of the MOS transistor.

In another embodiment, a memory device can comprise a capacitor structure comprising a first terminal and a second terminal, wherein the first terminal is configured as a first terminal of the memory device and is configured to receive a plurality of input voltages. The memory device can also comprise a selector device comprising a first electrode connected to the second terminal of the capacitor and a second electrode, wherein the selector device is in a high resistance state when a first voltage above a negative threshold voltage and below a positive threshold voltage is applied across the first electrode and the second electrode, and the selector device is in a low resistance state when a second voltage below the negative threshold voltage or above the positive threshold voltage is applied across the first electrode and the second electrode. The memory device can also comprise a MOS transistor connected to the selector device, wherein the MOS transistor comprises a gate connected to the second electrode of the selector device, a source configured as a second terminal of the memory device, and a drain configured as a third terminal of the memory device, wherein the MOS transistor is configured to switch between a high-conductivity state and a low-conductivity state in response to a magnitude of charge on the gate of the MOS transistor satisfying a condition with respect to a predetermined charge threshold.

In yet another embodiment, a circuit can comprise a voltage source configured to provide a programming voltage, an erase voltage, and a read voltage and a capacitor structure comprising a first terminal connected to the voltage source and a second terminal. The circuit can also comprise a selector device comprising a first electrode connected to the second terminal of the capacitor and a second electrode, wherein the selector device is configured to be in a low resistance state in response to the programming voltage and the erase voltage being applied to the first terminal of the capacitor structure and is configured to be in a high resistance state when the read voltage is applied to the first terminal of the capacitor structure. The circuit can also comprise a MOS transistor connected to the selector device, wherein the MOS transistor comprises a source, a gate and a drain, wherein the gate is configured to accumulate a first charge in response to the programming voltage being applied to the first terminal of capacitor structure and wherein the gate is configured to accumulate a second charge in response to the erase voltage being applied to the first terminal of the capacitor structure and wherein the gate is configured to maintain accumulation of the first charge or the second charge in response to the read voltage being applied to the first terminal of the capacitor structure, wherein a channel between the source and the drain is in a low resistance state when the gate maintains accumulation of the first charge.

According to one aspect of the invention, a method for operating a memory circuit comprising a capacitor structure, a selector device, and a MOS transistor, wherein the capacitor structure comprises a first terminal and a second terminal, the selector device comprises a first electrode connected to the second terminal, wherein the selector device is associated with an upper threshold voltage and a lower threshold voltage, and a second electrode connected to a gate of the MOS transistor and the MOS transistor also includes a source and a drain is disclosed. One technique includes applying a first voltage greater than the lower threshold voltage and less than the upper threshold voltage to the first electrode of the selector device, wherein the selector device is in a high resistance state in response thereto and a first charge is maintained on the gate of the MOS transistor, and applying a second voltage greater than the upper threshold voltage to the first electrode of the selector device, wherein the selector device enters a low resistance state in response thereto and a second charge accumulates on the gate of the MOS transistor. A process may include applying a third voltage greater than the lower threshold voltage and less than the upper threshold voltage to the first electrode of the selector device, wherein the selector device enters the high resistance state in response thereto and at least a portion of the second charge is maintained on the gate of the MOS transistor, wherein the portion of the second charge is greater than the first charge.

According to another aspect of the invention a memory device is disclosed. One apparatus may include a capacitor structure comprising a first terminal and a second terminal, wherein the first terminal is configured as a first terminal of the memory device and is configured to receive a plurality of input voltages. A device may include a selector device comprising a first electrode and a second electrode, wherein the first electrode is coupled to the second terminal of the capacitor, wherein the selector device is characterized by a high resistance state when a first voltage is applied across the first electrode and the second electrode, wherein the first voltage is greater than a negative threshold voltage and less than a positive threshold voltage, and wherein the selector device is characterized by a low resistance state when a second voltage is applied across the first electrode and the second electrode, wherein the second voltage greater than the positive threshold voltage and a MOS transistor coupled to the selector device, wherein the MOS transistor comprises a gate coupled to the second electrode of the selector device, a source and a drain, wherein the MOS transistor is characterized by a high-conductivity state or a low-conductivity state in response to a magnitude of charge stored on the gate.

According to yet another aspect of the invention, a circuit is disclosed. One circuit includes a voltage source configured to provide a programming voltage, an erase voltage, and a read voltage, and a capacitor structure coupled to the voltage source, wherein the capacitor structure comprises a first terminal coupled to the voltage source and a second terminal. A circuit may include a selector device coupled to the capacitor structure, wherein the selector device comprises a first electrode coupled to the second terminal of the capacitor and a second electrode, wherein the selector device is configured to be in a low resistance state in response to a first voltage being applied to the first terminal of the capacitor structure, wherein the first voltage comprises the programming voltage and the erase voltage, and wherein the selector device is configured to be in a high resistance state in response to the read voltage being applied to the first terminal of the capacitor structure. A circuit may include a MOS transistor connected to the selector device, wherein the MOS transistor comprises a source, a drain, a channel between the source and drain, and a gate coupled to the second electrode of the selector device, wherein the gate is configured to accumulate a first charge in response to the programming voltage being applied to the first terminal of capacitor structure, wherein the gate is configured to accumulate a second charge in response to the erase voltage being applied to the first terminal of the capacitor structure, and wherein the gate is configured to maintain accumulation of a charge accumulated on the gate in response to the read voltage being applied to the first terminal of the capacitor structure, wherein the channel between the source and the drain is in a conductive state when the gate maintains accumulation of the first charge, and wherein the channel between the source and drain is in a non-conductive state when the gate maintains accumulation of the second charge, wherein the first charge is larger than the second charge.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
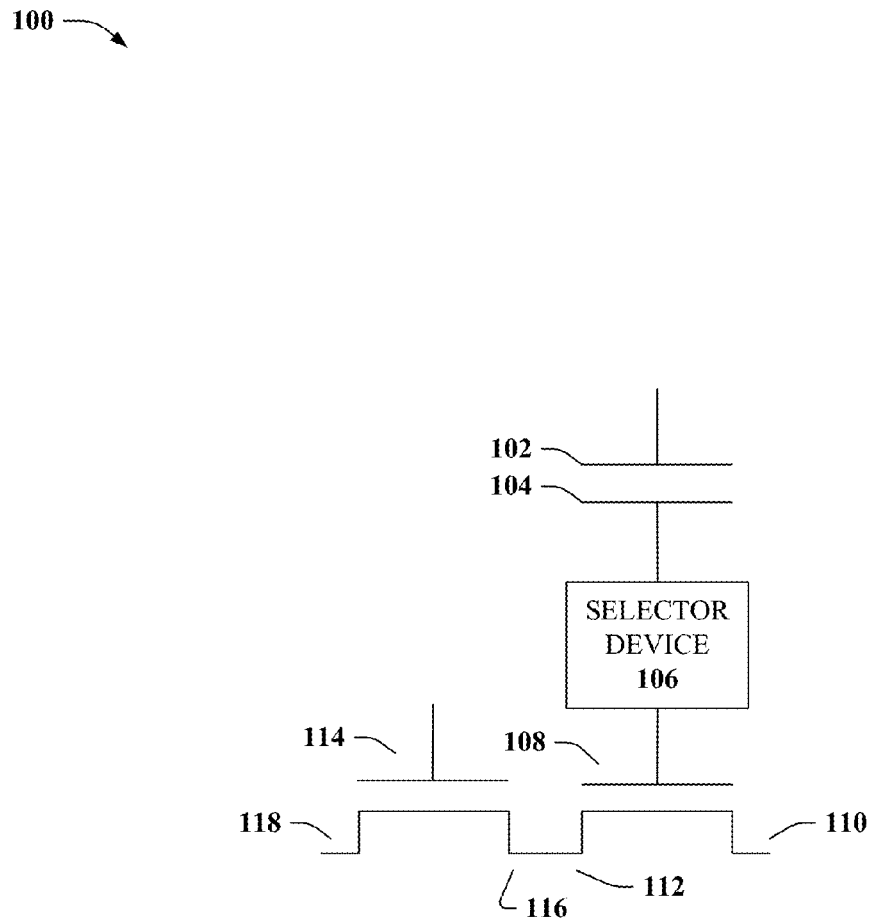
FIG. 1 illustrates a schematic diagram of an example non-volatile memory cell with a volatile element in accordance with various aspects described herein.

This disclosure relates to a non-volatile memory device comprising one or more volatile elements. In some embodiments, the non-volatile memory device can include a resistive two-terminal selector device that can be in a low resistive state or a high resistive state in response to respective voltages, or respective ranges of voltages, applied to the resistive two-terminal selector device. The selector device can be a volatile switching device with multiple thresholds (or narrow threshold ranges) (e.g., a positive threshold and a negative threshold). In various embodiments, the selector device is a resistive switching device, or a field induced superlinear threshold (FAST™) switching device (or selector device) under development by the assignee of the present invention. In addition to the resistive two-terminal selector device, the non-volatile memory device can include a capacitor structure and a MOS ("metal-oxide-semiconductor") transistor (which can act or operate as an additional capacitor, in at least some disclosed embodiments). A first terminal of the capacitor can be coupled to a voltage source, and the second terminal of the capacitor can be coupled to a first selector terminal of the selector device. In one or more embodiments, the MOS transistor can be an NMOS transistor comprising a floating gate connected to a second selector terminal of the selector device. Electrical conductivity between a source and drain of the NMOS transistor is modulated by a charge magnitude stored on the MOS transistor gate which is floating (e.g., typically not connected to a power source) during read operation. In one or more additional embodiments a second NMOS transistor can be provided having a source or drain connected in series with the source/drain of the first NMOS transistor.

In various embodiments, a disclosed volatile selector device can be a filamentary-based device. One example of a filamentary-based device can comprise: a first conductive layer, e.g., metal bearing layer (e.g. TiN, TaN, Cu, Al, Ag, or alloy thereof, etc.), doped p-type (or n-type) silicon (Si) bearing layer (e.g., p-type or n-type polysilicon, p-type or n-type polycrystalline SiGe, etc.); a resistive switching layer (RSL); and a second conductive layer (e.g. a material selected from the list described for the first conductive layer). Under suitable bias conditions, conductive ions form within the first conductive layer, and the first conductive layer provides conductive ions to the RSL. In various embodiments, a bias may be an applied voltage exceeding a magnitude of a threshold voltage (e.g. an applied voltage exceeding a positive threshold voltage). In various embodiments, the conductive ions become neutral metal particles in absence of the bias and form a conductive filament within the RSL that can facilitate electrical conductivity through at least a subset of the RSL. In some embodiments, the resistance of the filament-based device can then be determined by a tunneling resistance between the filament and the second conductive layer (or by an inherent resistivity of a conductive short through the RSL (e.g., formed by the metal particles forming the filament within the RSL)).

According to further embodiments, the second conductive layer can also comprise neutral metal particles capable of being ionized. In such embodiments, the second conductive layer can form metal ions and provide the metal ions to the RSL in response to a second suitable bias condition(s). In various embodiments, a bias may be an applied voltage exceeding a magnitude of a threshold voltage (e.g. an applied voltage less than a negative threshold voltage). Under suitable conditions, conductive ions are formed within the second conductive layer and depending upon bias conditions, the second conductive layer provides conductive ions to the RSL. In such embodiments, the conductive ions form neutral metal particles, in absence of the bias, and form a conductive filament within the RSL that can facilitate electrical conductivity through at least a subset of the RSL. The resistance of the filament-based device can then be determined by a tunneling resistance between the filament and the first conductive layer (or by an inherent resistivity of a conductive short through the RSL (e.g., formed by the ions forming the filament within the RSL)).

In various embodiments, if an applied voltage is about zero, e.g. ground, conductive filaments are not appreciably formed within the RSL. Accordingly, the resistance of the RSL layer is substantially higher than when the above embodiments are under the bias conditions described above.

In various embodiments of a memory cell of the present disclosure, a p-type or n-type Si bearing layer can include a p-type or n-type polysilicon, p-type or n-type polycrystalline SiGe, or the like. A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a non-zero value less than 2), and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number), a non-stiochiometric silicon-bearing material, a non-stiochiometric metal oxide, and so forth, or a suitable combination thereof. In various embodiments, the RSL includes few or a low number of material voids or defects which can trap conductive particles; accordingly, in some embodiments, the conductive particles have relatively good diffusive or drift mobility within the RSL.

A conductive material for the first conductive material and/or the second conductive material may include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, alloys, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus (or stimuli), and exhibits a second measurably distinct state in response to the suitable external stimulus (or stimuli). The volatile filamentary-based switching device is often referred to herein as a selector device, or selection device, filamentary selector device, filamentary-based selector device, and so on; though such devices, their composition or application should not be limited by this terminology. In various embodiments, a filamentary selector device is provided in a circuit to facilitate formation of a non-volatile memory cell, having very fast performance. In some embodiments, the non-volatile memory cell can have a read performance less than 20 nanoseconds (ns), less than 10 nanoseconds, or between 1 ns and 5 ns, in various embodiments. In various embodiments, a selector device developed by the assignee of the present invention, under the trademarks Field Assisted Superliner Threshold™ or FAST™, is utilized.

A filamentary selector device according to various disclosed embodiments can exhibit a first state (e.g., a first electrical resistance, or other suitable measurable characteristic) in the absence of a suitable external stimulus (or stimuli). The stimulus (or stimuli) can have a threshold value or range of such values that induces the filamentary selector device to change from the first state to a second state while the stimulus is applied. In response to the stimulus falling below the threshold value (or outside of the threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli, (e.g. response graph appearing like the letter "U"). As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), or switching in response to the same or similar magnitude of threshold stimulus, or range thereof, (though of opposite polarity or direction), or the like. In other embodiments, the third state can be distinct from the second state, either in terms of the measurable characteristic (e.g., different reverse electrical conductivity value in response to the reverse polarity as compared to a forward electrical conductivity value in response to the forward polarity) or in terms of threshold stimulus associated with transitioning out of the first state (e.g., a different magnitude of positive voltage required to transition to the second state, compared to a magnitude of negative voltage required to transition to the third state).

In other embodiments, the selector device may be a unipolar device, having a single threshold voltage. When an applied voltage, at least between ground and the threshold voltage is applied, the selector device has a high characteristic resistance. Further, when the applied voltage has a magnitude greater than the threshold voltage (e.g. more positive than a positive threshold voltage, or more negative than a negative threshold voltage), the selector device has a low characteristic resistance. In one embodiment, the selector device may have a response graph appearing like a reverse letter "L"). In some embodiments, two unipolar devices may be placed in parallel, with opposite polarity. It is expected that such a configuration of unipolar devices would provide a characteristic response similar to the bipolar selector device, described above (e.g. a response graph appearing like the letter "U").

As stated above, a disclosed filamentary based selector device can form a conductive path or filament through a relatively high resistive portion in response to a suitable external stimulus (or range of stimulus). The external stimulus (or stimuli) can cause metallic particles within a terminal of the selector device (e.g., active metal layer terminal, conductive layer terminal, etc.) to migrate within (or ionize within) a RSL layer of the filamentary selector device. Further, the RSL can be selected to have relatively few physical defect locations for the volatile filamentary switching device, facilitating relatively good mobility of the metallic particles within the RSL. Accordingly, with respect to a forward direction and positive polarity stimulus, below an associated positive threshold stimulus (or narrow range of positive threshold values), the metallic particles can disperse within the RSL, resisting or avoiding formation of a sufficient conductive path through the RSL to lower a high resistance associated with the first state. Above the threshold, the external stimulus maintains the metallic particles in sufficient formation to provide the conductive path, leading to relatively low resistance of the second state. An analogous mechanism can control operation of the third state (in a reverse direction and reverse polarity stimulus) in the bipolar context.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar switching device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventor(s) of the present application is of the opinion that two-terminal memory devices, such as resistive switching memory devices, have various advantages in the field of electronic memory. For instance, resistive-switching memory technology can generally be small, typically consuming silicon area on the order of $4F^2$ per adjacent resistive-switching device where F stands for the minimum feature size of a technology node (e.g., a memory cell comprising two resistive-switching devices would therefore be approximately $8F^2$ if constructed in adjacent silicon space if on the order of $4F^2$). Non-adjacent resistive-switching devices, e.g., stacked above or below each other, can consume as little as $4F^2$ for a set of multiple non-adjacent devices. Moreover, multi-bit devices having two, three or more bits (e.g., resistance states) per memory cell can result in even greater densities in terms of bits per silicon area consumed. These advantages can lead to greater semiconductor component density and memory density, and low manufacturing costs for a given number of digital storage bits. The inventor(s) also believes that resistive-switching memory can exhibit fast programming speed and low programming current, and smaller cell sizes enabling greater component densities. Other benefits anticipated by the inventor(s) include non-volatility, having the capacity to store data without continuous application of power, and capacity to be built between metal interconnect layers, enabling resistive switching based devices to be usable for two-dimension as well as three-dimension semiconductor architectures.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies capable of being operated with volatile characteristics in response to an external stimulus, can be utilized for some of the disclosed embodiments, where suitable to one of ordinary skill in the art.

Overview

The volatile element of disclosed non-volatile memory cells, the selector device, can have a low resistance state and a high resistance state based on the voltage being applied by the voltage source to the first terminal of the capacitor. Between a range of deactivation voltages (e.g., from a negative threshold voltage to a positive threshold voltage, or other suitable positive range, negative range, or range spanning positive and negative voltages) the resistance can be very high, whereas outside the range of deactivation voltages, the resistance can be much lower, facilitating current flow (and charge transfer) across the selector device. As a magnitude of voltage across the selector device, starting within the range of deactivation voltages, is increased (e.g., increasing with time), charge first accumulates very slowly on the gate of the MOS transistor connected to a second terminal of the selector device. Once the magnitude of the voltage leaves the range of deactivation voltages and exceeds a first threshold voltage (e.g., a positive threshold, or a narrow range of positive threshold voltages), the selector device enters the low resistance state and conducts current to the MOS transistor, enabling charge to accumulate much more quickly on the gate of the MOS transistor. As the voltage decreases below the positive threshold (or narrow range of positive threshold voltages), the selective device enters the high resistance state and becomes non-conductive. The non-conductivity of the selector device serves to trap charge that accumulated at the gate of the MOS transistor as stated above. When the voltage source returns to zero, the charge trapped at the gate of the MOS transistor can still remain, resulting in a measurable potential difference greater than zero (e.g., about 0.5 volts, about 0.75 volts, about 1 volt, or any other suitable voltage measurably distinct from zero). This trapped measurable charge can cause the MOS transistor to be in a second state, different from a first state in which less charge is trapped at the gate of the MOS transistor. The two states of the MOS transistor provide a bit of non-volatile storage.

In an erase cycle, a decreasing negative voltage is applied, and while the selector device is in a high resistance state, charge at the gate of the MOS transistor decreases slowly. Once the selector device switches to the low resistance state, the charge decreases more rapidly with decreasing negative voltage. The selector device switching to the low resistance state occurs when the decreasing negative voltage again leaves the range of deactivation voltages (e.g., drops below a negative threshold voltage, or narrow range of negative threshold voltages). The positive charge generated by the positive voltage (described above) decreases rapidly (e.g., is replaced by a negative charge in some embodiments) and changes a state of the MOS transistor from the second state back to the first state. In some embodiments, negative charge accumulates quickly with the selector device in the low resistance state, and then as the applied voltage returns to zero and the selector device returns to the high resistant state, a negative charge remains accumulated on the gate of the MOS transistor. Since the current leakage of the selector device can be very low (e.g., measured in atto-amps in at least some disclosed embodiments), the charge on the gate of the MOS transistor can retain a magnitude suitable to maintain the changed state of the MOS transistor for a long period of time. These two different stable states of positive charge and negative charge accumulation on the gate of the MOS transistor provide non-volatile characteristics for the disclosed memory cells.

Non-Limiting Examples a Non-Volatile Memory Cell Utilizing Volatile Switching Two Terminal Device and a MOS Transistor Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring now to the drawings, in FIG. 1 illustrated is a schematic diagram of an example non-volatile memory cell 100 with a volatile element in accordance with various aspects described herein. Non-volatile memory cell 100 can include a resistive two-terminal selector device 106 that can be in a low resistive state or a high resistive state depending on the voltage being applied. A capacitor with a first terminal 102 and a second terminal 104 connected to the selector device 106 can also be provided. A first MOS transistor (e.g., an NMOS transistor, or other suitable MOS transistor) can include a gate 108 connected to the selector device 106, a source 110, and a drain 112. In an embodiment, the drain 112 can also be connected in series with a second transistor that includes a gate 114, a source 116 and a drain 118.

Selector device 106 can be a two-terminal device configured to be operable in response to a suitable electric signal applied at one or more of two terminals of selector device 106. In various disclosed embodiments, selector device 106 can have a non-linear I-V response, in which selector device 106 exhibits current within a first range in response to a first range of voltage magnitudes, and current within a second range (e.g., much higher in magnitude than the first range) in response to a second range of voltage magnitudes (e.g., see FIG. 3, infra). The first range of voltage magnitudes and second range of voltage magnitudes can be distinguished, as one example, by a threshold voltage, or a threshold range of voltages (e.g., having magnitude(s) between the first range of voltage magnitudes and the second range of voltage magnitudes). In various embodiments, selector device 100 may be embodied as a Field-Assisted Superlinear Threshold (FAST™) selector device, currently under development by the current assignee of the present patent application and is disclosed in U.S. Non-Provisional application Ser. No. 14/588,185 filed Dec. 31, 2014, the entirety of which is incorporated herein for all purposes.

Selector device 106 can comprise a top electrode and a bottom electrode. The top electrode and bottom electrode of selector device 106 are electrical conductors, and are comprised of materials suitable to facilitate conduction of current. In one or more embodiments, the top electrode and bottom electrode of selector device 106 can comprise a material(s) providing or facilitating provision of mobile atoms or ions in response to a suitable stimulus. Examples of suitable stimuli can include an electric field (e.g. a programming voltage), joule heating, a magnetic field, or other suitable stimuli for directed or partially directed particle motion. In an embodiment the memory cell 100 can be formed by back to back-end-of-line metal layers of a semiconductor chip. In another embodiment, the memory cell 100 and circuit can scale below the 20 nm technology size.

Examples of suitable materials for the top electrode or bottom electrode of selector device 106 can include a noble metal (e.g., Ag, Pd, Pt, Au, etc.) or a metal alloy containing noble metal in part (e.g., Ag—Al, Ag—Pd—Cu, Ag—W, Ag—Ti, Ag—TiN, Ag—TaN, and so forth). A noble metal or alloy thereof can be utilized to facilitate mitigated interaction between the top electrode or the bottom electrode and a selector layer of selector device 106 situated between the top electrode and the bottom electrode, for instance. This mitigated particle interaction (e.g., mitigating or avoiding chemical bonding of the top electrode particles or the bottom electrode particles with particles of selector layer 104) can facilitate improved longevity and reliability for selector device 106, as one example. Another example of a suitable material for the top electrode or the bottom electrode can include a material with relatively fast diffusing particles. Faster diffusion can include, for instance, a capacity to move among defect sites (e.g., voids or gaps in molecular material) within a solid, facilitating dispersion of the relatively fast diffusion particles absent a suitable aggregating force, for instance (e.g., an external voltage of greater than a threshold magnitude). Materials with relatively fast diffusing particles can facilitate fast state switching of selector device 106 (e.g., from a non-conductive state to a conductive state), at lower bias values. Examples of suitable fast diffusing materials can include Ag, Cu, Au, Co, Ni, Al, Fe, or the like, suitable alloys thereof, or suitable combinations of the foregoing.

In at least one embodiment, the top electrode of selector device 106 can be comprised of the same material or substantially the same material as the bottom electrode of selector device 106. In other embodiments, the top electrode and bottom electrode can be different materials. In still other embodiments, the top electrode and bottom electrode can be at least in part the same material, and in part different materials. For instance, the top electrode could comprise a suitable conductive material, and the bottom electrode could at least in part comprise an alloy of the suitable conductive material, or the suitable conductive material in combination with another suitable conductor, as an illustrative example.

In addition to the foregoing, selector device 106 includes a selector layer disposed between the top electrode and the bottom electrode of selector device 106. In contrast to top electrode or bottom electrode, however, the selector layer can be an electrical insulator or ionic conductor. Further, the selector layer can be a material (e.g., an oxide) at least weakly permeable to particles of the top electrode or bottom electrode. In some embodiments, the selector layer can be a non-stoichiometric material. Examples of suitable materials for selector layer 104 can include non-stiochiometric materials, such as: $SiO_X$, $TiO_X$, $AlO_X$, $WO_X$, $Ti_XN_YO_Z$, HfOx, TaOx, NbOx, or the like, or suitable combinations thereof, where x, y and z can be suitable non-stoichiometric values. In some embodiments, the selector layer can be a (doped or undoped) chalcogenide or a solid-electrolyte material containing one or more of Ge, Sb, S, Te. In yet another embodiment, the selector material can comprise a stack of a plurality of the above mentioned materials (e.g. SiOx/GeTe, TiOx/AlOx, and so forth). In at least one embodiment of the present disclosure, the selector layer can be doped with a metal(s) during fabrication, to facilitate metal ion injection from the top or bottom electrode.

In response to a suitable signal applied at non-volatile memory cell 100, selector device 106 can transition from a non-conducting state having a high electrical resistance and a first current (or a first range of currents), to a relatively-conducting state having a lower electrical resistance and a second current (or a second range of currents). In various embodiments, a current ratio of the first current to the second current can be at least about 1,000 or more. For instance, in one embodiment, the current ratio can be selected from a range of current ratios from about 1,000 to about 10,000. In another embodiment, the current ratio can be selected from a range of current ratios from about 10,000 to about 100,000. In yet another embodiment, the current ratio can be selected from a range of current ratios from about 100,000 to about 1,000,000. In still other embodiments, the current ratio can be selected from a range of current ratios from about 1,000,000 to about 10,000,000 or more. In a further embodiment, the current ratio can be within a range of current ratios from about 10E9 to about 10E11. Other suitable current ratios can be provided for a selector device 106 in various other suitable embodiments. It is expected with further research, current ratios of up to 10E15 or 10E18 may be obtainable.

Figure 2:
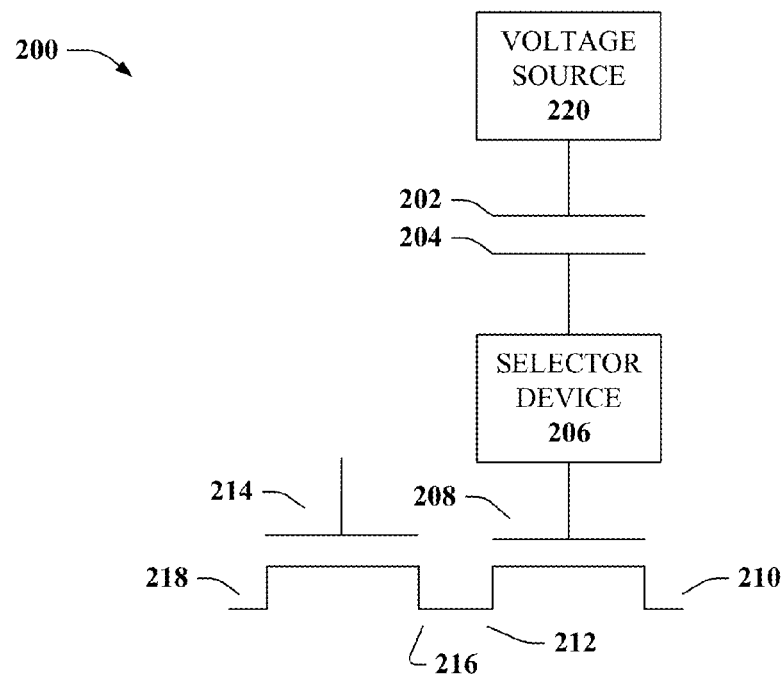
FIG. 2 illustrates a schematic diagram of an example non-volatile memory cell with a volatile element in accordance with various aspects described herein.

Turning now to FIG. 2, illustrated is a schematic diagram of an example non-volatile memory device 200 comprising a volatile element in accordance with various aspects described herein. Non-volatile memory device 200 can include a resistive two-terminal selector device 206 that can be in a low resistive state or a high resistive state depending on the voltage being applied by a voltage source 220. The voltage source 220 can be coupled to a first terminal 202 of a capacitor that has a second terminal 204 connected to a first selector terminal (e.g., a top electrode) of the selector device 206. A first MOS transistor (e.g., an NMOS transistor, or other suitable transistor) can include a gate 208 connected to a second selector terminal (e.g., a bottom electrode) of the selector device 206, a source 210, and a drain 212. In an embodiment, the drain 212 can also be connected in series with a second MOS transistor that includes a gate 214, a source 216 and a drain 218.

The following is an illustrative example, though it should be appreciated that the disclosed voltages are not limiting, and other voltages and ranges of voltages for a selector device 206 can be applicable in addition or instead. According to the example, if the voltage applied to first terminal 202 by voltage source 220 such that the effective voltage across terminals of selector device 206 is between a negative and positive voltage threshold of about −1.7V to about +1.7V (merely as example voltages), the selector device 206 can be (or remain) in a high resistance state. In the high resistance state, the capacitor, the selector device 206 and the first MOS transistor act in an electrical sense as series capacitors (or approximate a capacitor(s)). Accordingly, voltages dropped across respective ones of the capacitor, selector device 206 and the first MOS transistor increase in response to increasing voltage applied by voltage source 220 in proportion to their respective capacitive coupling ratios.

In some embodiments, if the voltage applied across selector device 206 is beyond the range of about −1.7V to about 1.7V, the selector device 206 can enter a low resistance state and will conduct a much larger current (e.g., no longer acting as a capacitor). In contrast, in a high resistance state, an increasing voltage applied by voltage source 220 causes an extremely slowly increasing charge to accumulate at the gate 208 (e.g., because of the high resistivity of selector device 206 in its high resistance state). When the voltage applied across at the selector device 206 is outside the above range of about −1.7V to about 1.7V (e.g., Voltage source <~−1.7, or Voltage source >~1.7) and selector device 206 transitions to a low resistance state, the charge at gate 208 will increase at a similar rate to the increasing potential across the selector device 206. In various embodiments, the positive and negative threshold voltages may be different, e.g. −1.5 v and 1.7 v; −1 v and 1.5 v; −1.1 v and 1.2 v; or the like, depending upon specific configuration.

In various embodiments, after the voltage applied by voltage source 220 peaks and begins to decrease in magnitude, the charge at gate 208 will decrease in proportion with a decreasing potential across selector device 206. Once the voltage applied by voltage source 220 across selector device 206 drops below the threshold of about 1.7V, the selector device 206 enters into a high resistance state again, and the charge dispersion rate at gate 208 decreases greatly. After the voltage applied by voltage source 220 goes to zero, a portion of the accumulated charge remains at gate 208, suitable to cause the MOS transistor in a conductive 'on' state during read operation.

In a similar manner, the voltage source 220 can apply a negative voltage to terminal 202 of the capacitor and the charge accumulated at gate 208 will decrease at a very small rate based on the capacitive ratios of the capacitor, selector device 206 and MOS transistor. Once the negative voltage applied across selector device 206 goes below the negative voltage threshold however, and selector device 206 transitions to a low resistance state, charge at gate 208 (stored above) can decrease (in some embodiments) or accumulate a negative charge (in other embodiments) at a much faster rate.

In some embodiments, as the negative voltage decreases in magnitude toward zero volts, the voltage across selector device 206 increases relative to the negative threshold voltage, and selector device 206 reenters the high resistance state, and a second charge (e.g., low charge, negative charge, etc.) will remain at gate 208. The trapped charge is typically suitable to cause the MOS transistor to be non-conductive (an off state) during a read operation between a source and drain.

This cycling of positive and negative voltages is the program and erase cycle of the memory cell, and a read voltage can be applied to determine whether the MOS transistor is conducting (e.g., in the second state) or non-conducting (e.g., in the pre-charge state). Based on the read voltage and MOS transistor state, it can be determined whether the memory cell is programmed or erased, for example.

Figure 3:
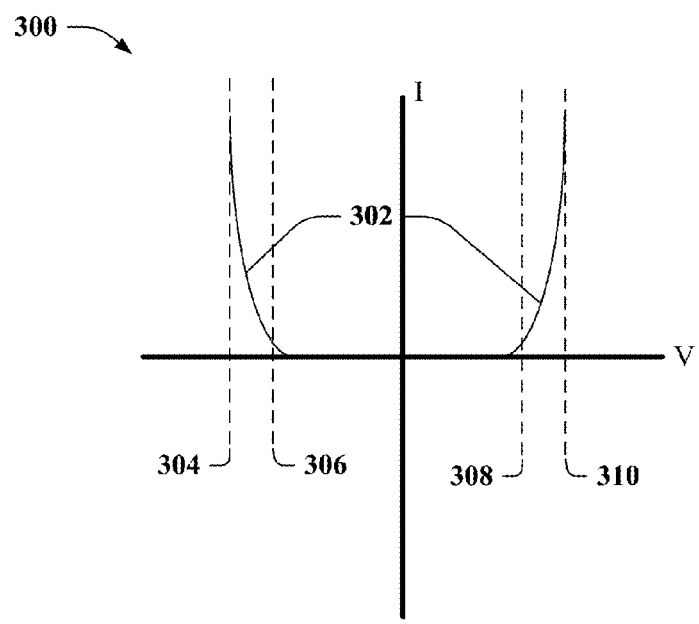
FIG. 3 illustrates a graph showing resistance of a switching device in accordance with various aspects described herein.

FIG. 3 shows a graph 300 an I-V response 302 of a selector device for a range of positive and negative voltages. The x-axis of the graph represents voltage, and the y-axis of the graph shows current. In between the negative and positive voltages 306 and 308, very little current is conducted by the selector device, and the selector device effectively behaves like a high resistance resistor, or even a capacitor. In the range of negative voltages 304 and 306 as well as positive voltages 308 and 310, the selector device very quickly transitions to a low resistance state. The ratio of resistances between the high resistance state and the low resistance state can be in the vicinity of $1 \times 10^7:1$ to $1 \times 10^{10}:1$, in at least some disclosed embodiments.

In an embodiment, the selector device can begin to transition from a high resistance state to a low resistance state at about −1.7V and about +1.7V (306 and 308 respectively). The transition can be complete by about −2V and about +2V (304 and 310 respectively). In other embodiments, the voltage threshold 306/308 can begin at ±1.5V and the selector device can be fully transitioned into the low resistance state by ±1.8V (304/310). In still other embodiments, negative voltages 304/306 and positive voltages 308/310 can have other respective ranges of voltage values. The magnitudes of the thresholds need not be symmetric (e.g. −1.3 volts and +1.5 volts).

Figure 4:
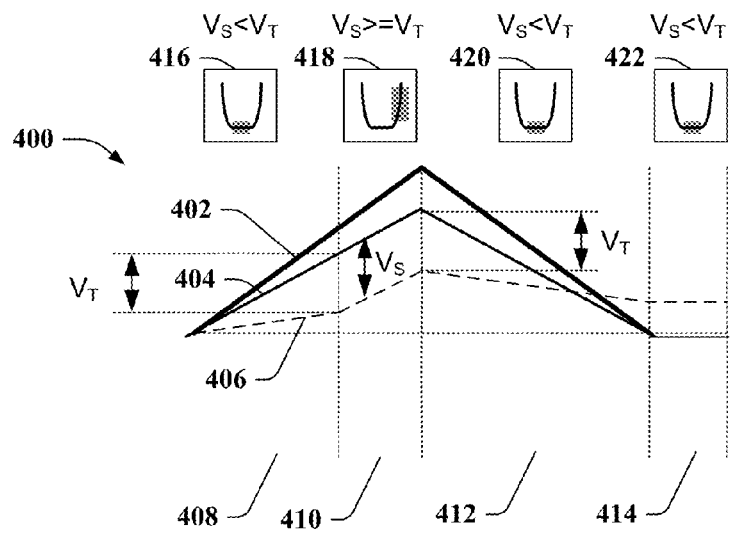
FIG. 4 illustrates a schematic diagram of an example non-volatile memory cell in a program phase in accordance with various aspects described herein.

Turning now to FIG. 4, illustrated is a diagram 400 of an example non-volatile memory cell in a program phase in accordance with various aspects described herein. This graph shows the voltages applied at the first terminal of the capacitor (e.g., 202), bold line 402, a first terminal of the selector device (e.g., 206) solid line 404, and MOS transistor gate (e.g., 208) dashed line 406. The vertical distance between solid line 404 and dashed line 406 is $V_S$ and represents the voltage across the selector device. During time period 408, as the applied voltage 402 increases and the voltages at each of the elements increase at respective rates, the relative increases in voltage are based on the respective capacitive ratios of the 3 elements (e.g., capacitor, selector device and MOS transistor gate). The voltage increases fastest at the first terminal 402, approximately equal to the increasing supply voltage, while at a slower rate at the first terminal of the selector device and an even slower rate at the MOS transistor gate, as depicted by signals 404 and 406 respectively during time period 408. Also, during the time period 408, the selector device is in a high resistance state shown by I-V graph 416 (with current on a vertical axis and voltage on a horizontal axis), conducting very little current as depicted by the shaded bottom portion of I-V graph 416. Within region 408 $V_S<V_T$, where $V_T$ is the positive threshold voltage associated with the selector device.

During time period 410 however, the voltage 402 has increased such that the voltage across the selector device, $V_S$ begins to exceed $V_T$. In such a situation, that the selector device transitions into a low resistance state, as shown in the shaded portion of I-V graph 418 (where the rapidly increasing current on the right-side vertical line is shaded). In various embodiments, $V_S$ is approximately clamped to $V_T$. In one embodiment, the transition occurs when the difference between the voltage 404 and 406, e.g. the voltage across the selector device exceeds a positive threshold voltage (e.g. about 1.5 to about 1.7 volts.) In some embodiments, voltage source 402 applies a voltage exceeding about 3.2 volts, for the voltage across the selector device $V_S$ to exceed the positive threshold voltage $V_T$. It should be understood that in other embodiments, the voltage applied by voltage source 402 to achieve the threshold voltage across the selector device will vary depending upon the design parameters and characteristics of the capacitor structure, the selector device, and the MOS transistor.

In various embodiments, within time period 410, the selector device essentially becomes a conductor (as a result of filament formation, discussed above), and the voltage 406 increases at the MOS gate at a faster rate than it did within time period 408. During this time period 410, the rate of increase of the voltage 404 decreases slightly (not shown in FIG. 4 due to the scale of the change) since the selector is in a conductive state and does not act as a capacitor any more, thus changing the capacitive ratio(s) of the circuit. The rate of voltage increase at 406 then matches the rate of increase of signal voltage 404. Thus, for time period 410, the rate of voltage increase 404 at the first terminal of the selector device is equal to or approximately equal to the rate of voltage increase 406 at the gate of the MOS transistor, as $V_S$ remains approximately clamped at $V_T$. In various embodiments, during time period 410, charges are conducted across the selector device and stored on the gate of the MOS transistor.

During time period 412, the voltage applied by the voltage source has peaked and decreases slowly, and the voltages at the three elements ramp down and as shown in I-V graphs 420 and 422. In other embodiments, the slope or rate of decrease may be different from the slope or rate increase within time periods 408 and 410. In time period 412, the selector device transitions back to the high resistance state (e.g., in time period 412) and maintains the high resistance state (e.g., in time period 414). More particularly, as the applied voltage 420 begins to decrease, the voltage $V_S$ drops below about $V_T$, and thus the selector device enters a high resistance state, and appears as a capacitor in series with the capacitor (plates 202 and 204) and the MOS transistor (having gate 208. The relative decreases in voltage within time period 412 at each of the three elements are then based on respective capacitive coupling ratios of the three devices, following transition of the selector device to the high resistance state, and so when time period 412 ends, there is still some charge accumulated at the gate of the MOS transistor shown by line 406, even though the capacitor and selector device both reach zero voltage. In time period 414, a small voltage (and thus accumulated charge) of roughly 0.75V remains at the gate of the MOS transistor.

Figure 5:
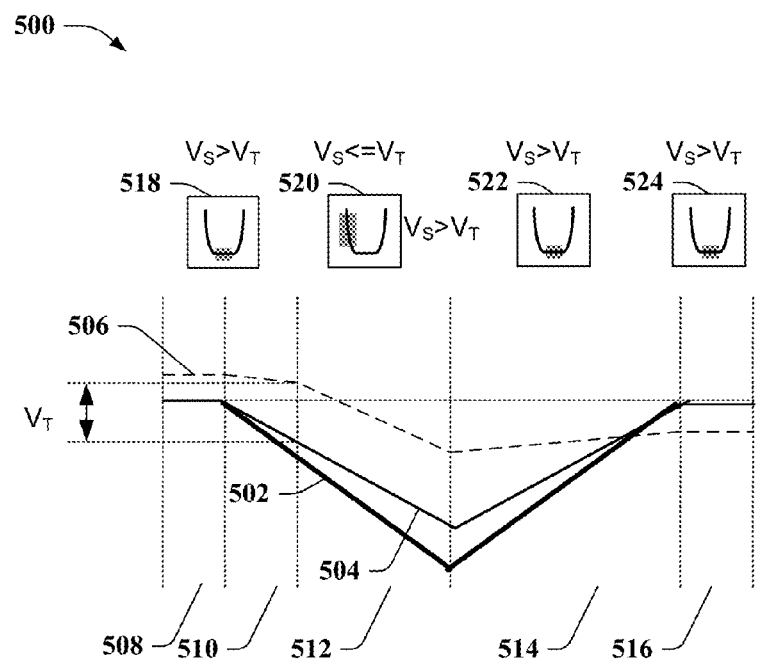
FIG. 5 illustrates a schematic diagram of an example non-volatile memory cell in an erase phase in accordance with various aspects described herein.

Turning to FIG. 5, illustrated is a diagram 500 of an example non-volatile memory cell in an erase phase in accordance with various aspects described herein. This graph shows the voltages applied at each of the first terminal of the capacitor (e.g., 202), bold line 502, first terminal of the selector device (e.g., 206), solid line 504, and MOS transistor gate (e.g., 208), dashed line 506. The vertical distance in phase 510 between dashed line 506 and solid line 504 is $V_T$ and represents the negative threshold voltage associated with the selector device while $V_S$ is the voltage across the selector device. Within regions 508 and 510, $V_S>V_T$. During time period 508, there is no voltage applied by the voltage source, and the voltages at the first terminal of the capacitor and the selector device are zero, while the gate of the MOS transistor retains the voltage acquired during a previous program phase (e.g., FIG. 4). Since the selector device is in a high resistance state as shown in I-V graph 518, charge accumulated at the MOS transistor gate 208 will remain due to the high resistance of the selector device and lack of an external voltage stimulus. In time period 510 however, as a decreasing negative voltage is applied by the voltage source, the voltage drops at the first terminal, selector device and the gate at the rate determined by the respective capacitive ratios.

In phase 512 however, the voltage 502 at the selector device ($V_S$) has crossed the negative voltage threshold $V_T$ and the selector device transitions to a low resistance state as shown in I-V graph 520. In one embodiment, $V_S$ is approximately clamped to $V_T$. In one embodiment, the transition occurs when the difference between the voltage 504 and 506, e.g. the voltage across the selector device exceeds the negative threshold voltage (e.g. about −1.5 to about −1.7 volts.) In some embodiments, voltage source 502 applies a voltage exceeding about −3.2 volts, for the voltage across the selector device $V_S$ to exceed the negative threshold voltage $V_T$. It should be understood that in other embodiments, the voltage applied by voltage source 502 to achieve the threshold voltage across the selector device will vary depending upon the design parameters and characteristics of the capacitor structure, the selector device, and the MOS transistor.

In phase 512, since the capacitive ratio of the circuit changes due to the transition of the selector device (as a result of filament formation, discussed above), the rate of change of the signal 504 decreases slightly since the selector is in a conductive state and does not act as a capacitor any more, thus changing the capacitive ratio(s) of the circuit. (Not shown in FIG. 5 due to the scale of the change). The voltage 506 at the gate begins to drop at the same/similar rate as the voltage at the selector device 504 until time period 514, when the negative voltage is withdrawn, and the selector device transitions to high resistance state as shown in I-V graph 522. More particularly, as the applied voltage 502 begins to decrease, the voltage $V_S$ drops below about $V_T$, and thus the selector device enters a high resistance state, and appears as a capacitor in series with the capacitor and the MOS transistor. The supply voltage 502 and voltage at the first terminal of the selector device 504 continue to decrease to zero. Eventually, by time period 516, a negative voltage remains at the gate of the MOS transistor, whereas voltages 502 and 504 have returned to zero. Since the selector device is in low resistance state (e.g., I-V graph 524) and there is no external voltage stimulus applied, the negative charge and a voltage of roughly −0.75V remain at the gate of the MOS transistor.

Figure 6A:
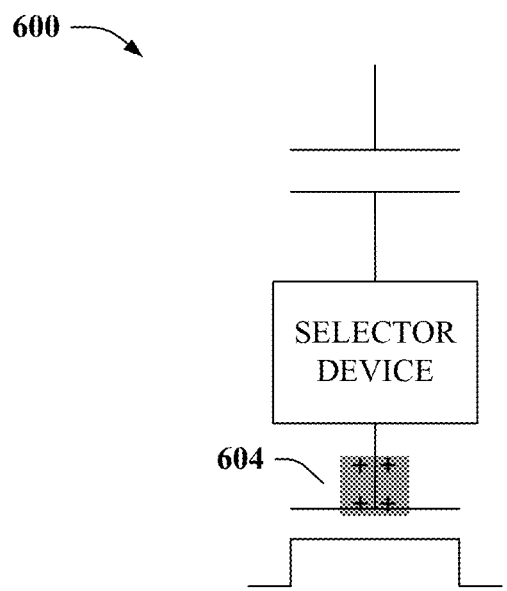
FIG. 6A illustrates a schematic diagram of an example memory cell with accumulated charge in accordance with various aspects described herein.
Figure 6B:
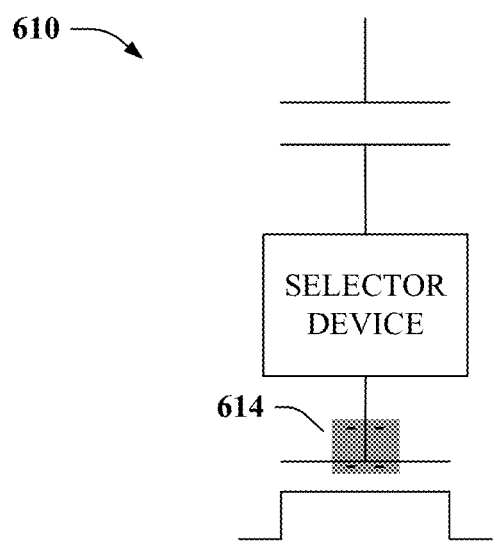
FIG. 6B illustrates a schematic diagram of an example memory cell with accumulated charge in accordance with various aspects described herein.

Turning now to FIGS. 6A and 6B, illustrated are schematic diagrams of exemplary memory cells 600 and 610 with accumulated charges 604 and 614 in accordance with various aspects described herein. In FIG. 6A, the diagram shows the memory cell 600 after a program cycle, where positive charge 604 has accumulated on the gate of the MOS transistor (e.g., NMOS transistor) in response to the positive applied voltage from a voltage source. In FIG. 6B, the diagram shows the memory cell 610 after an erase cycle, where negative charge 614 has accumulated on the gate of the MOS transistor in response to the negative applied voltage from a voltage source.

Figure 7:
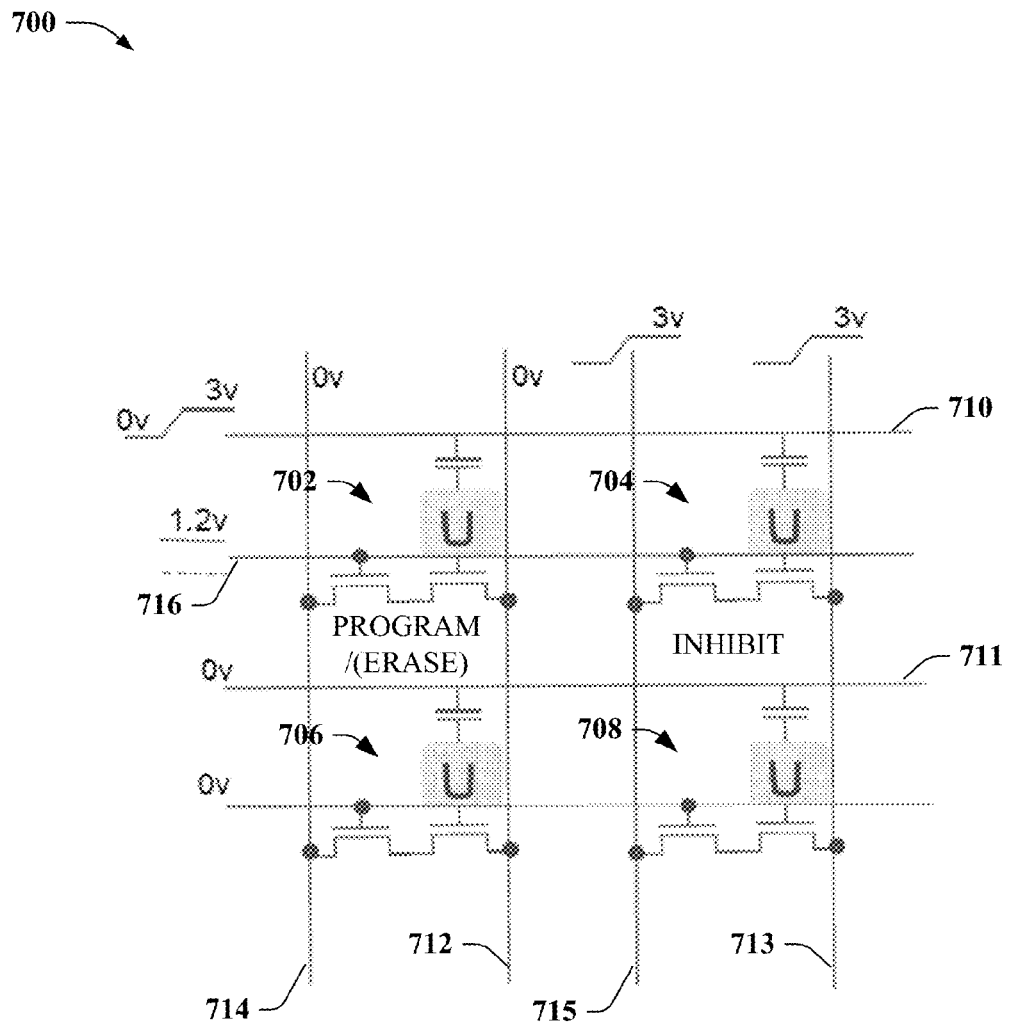
FIG. 7 illustrates a schematic diagram of an example memory cell array in accordance with various aspects described herein.

Turning now to FIG. 7, illustrated is a schematic diagram of an example memory cell array 700 in accordance with various aspects described herein.

FIG. 700 can be a crossbar array, in at least one embodiment, with a plurality of wordlines (e.g., 710, 711) and a plurality of bitlines (e.g., 712, 713, 714, 715) having respective memory cells 702, 704, 706, 708 at respective intersections thereof (or subsets of those intersections). Respective first terminals of respective capacitors in each memory cell 702, 704, 706, and 708 can be connected to one of the wordlines, and the source of the first MOS transistor in each cell can be coupled to a first subset of the bitlines 712, 713, and the drain of the second MOS transistor in each cell can be coupled to a second subset of the bitlines 714, 715. The crossbar array can also include a plurality of read enable lines (e.g., 716) that respectively connect to gates of second MOS transistors on a particular row of memory cell array 700.

To inhibit programming of memory cell 704 and selectively program memory cell 702, bitlines 713 and 715 are pulsed high (e.g., three volts), synchronously (or approximately synchronously) with a program signal applied to wordline 710. Memory cell 702 is programmed in response to the program signal at wordline 710, by maintaining bitlines 712, 714 at zero volts (or grounded). Similarly, to selectively erase memory cell 702, bitlines 713 and 715 are pulsed low (e.g., negative three volts, not depicted) synchronous with or approximately synchronous with a negative voltage (not depicted) applied at wordline 710, thereby inhibiting memory cell 704. Bitlines 712, 714 are grounded and so memory cell 702 is erased in response to the negative voltage applied at wordline 710.

Figure 8:
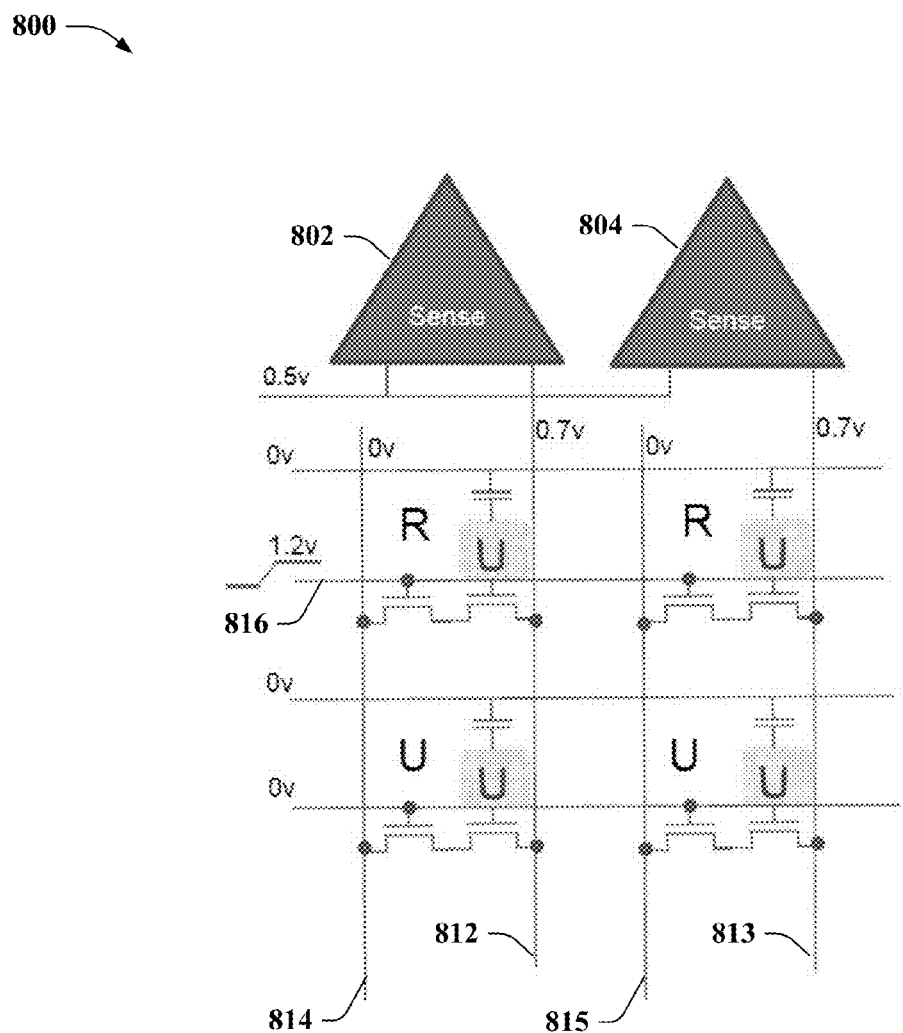
FIG. 8 illustrates a schematic diagram of an example memory cell array with a sensing device in accordance with various aspects described herein.

Turning now to FIG. 8, illustrated is a schematic diagram of an example memory cell array 800 with sensing devices 802 and 804 in accordance with various aspects described herein. In an embodiment, the cell array 800 is a 2×2 array, but in other embodiments, larger or smaller arrays are possible. The sensing devices 802 and 804 can provide a read voltage (e.g., around 0.7V in some embodiments) on respective ones of a first subset of bitlines, 812, 813, while respective ones of a second subset of bitlines 814, 815 are grounded and a read enable line 816 is set to a read enable voltage (e.g., 1.2 volts). For example, with reference to memory cells connected to read enable line 816, current will pass through the respective series combination of MOS transistors of each cell if the first MOS transistor (connected to the selector device) is conducting (e.g., programmed). The memory cells connects the read voltage of 0.7V applied at the first subset of bitlines 812 and 813 to the second set of bitlines 814 and 815 where 0V is applied, lowering the read voltage. The sense amp will detect the lowered bitline read voltage in response to the bitline read voltage dropping below a reference voltage (e.g., 0.5V). By contrast, current will not conduct between the respective first subset of bitlines (812, 813) and the respective second subset of bitlines (814, 815) in response to the first MOST transistor being non-conducting (e.g., programmed). The read voltage on the first subset of bitlines will not discharge and the sense amp output will indicate that the cell is erased.

The aforementioned diagrams have been described with respect to interaction between several components of a memory cell, or memory architectures comprised of such memory cells. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a read process or a write process can comprise an inhibit process, or the like, or vice versa, to facilitate selective reading or writing to subsets of memory cells on a common line. Components of the disclosed architectures can also interact with one or more other components not specifically described herein but known by those of skill in the art.

Figure 9:
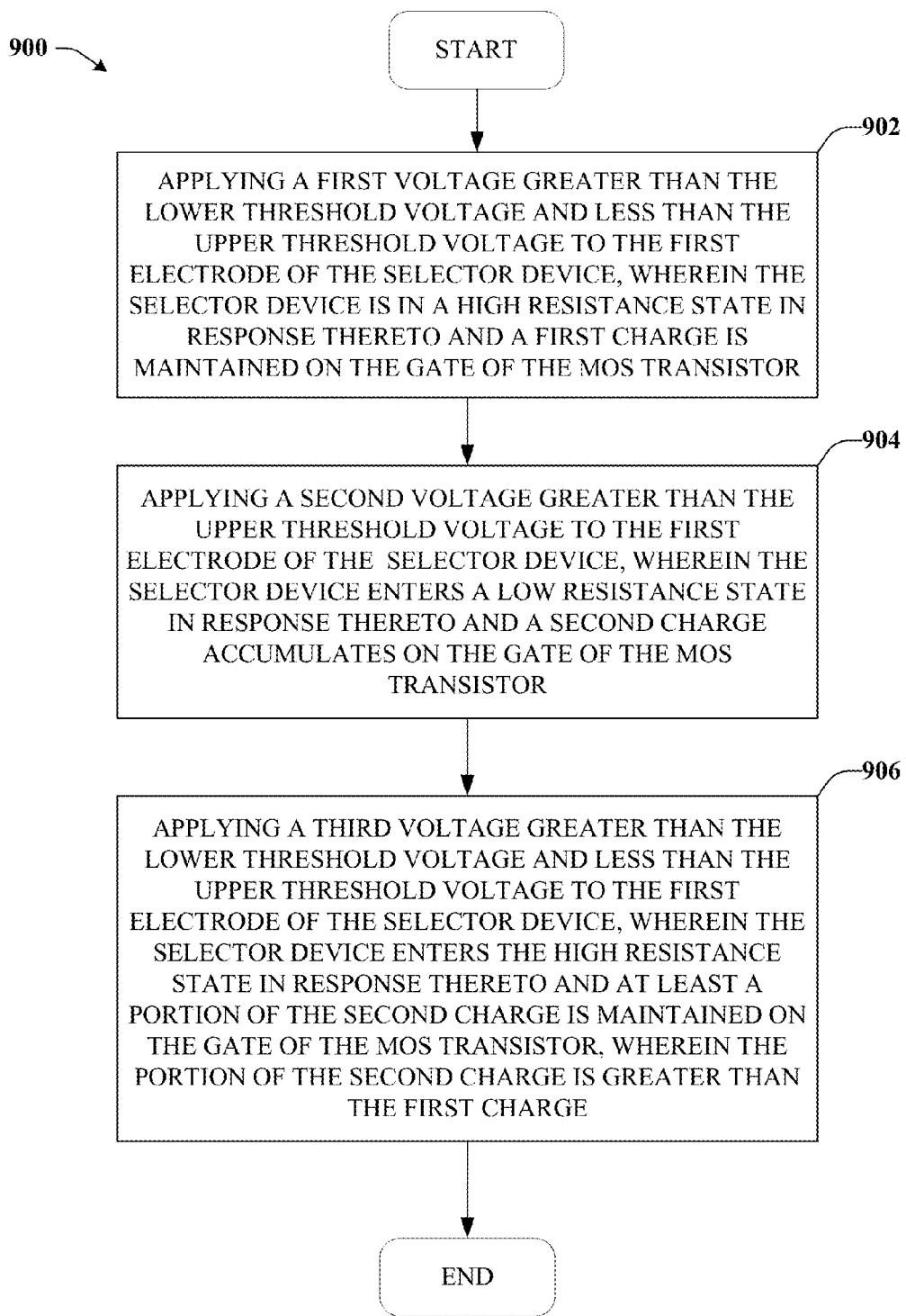
FIG. 9 illustrates a flowchart of an example method for operating a non-volatile memory cell with a volatile element according to one or more embodiments disclosed herein.

In view of the exemplary diagrams described supra, process methods that can be implemented in accordance with the disclosed subject matter will be better appreciated with reference to the flow chart of FIG. 9. While for purposes of simplicity of explanation, the methods of FIG. 9 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

Turning now to FIG. 9, a flowchart of an example method for operating a non-volatile memory cell with a volatile element according to one or more embodiments disclosed herein is illustrated. Flowchart 900 can begin at 902 where the method includes applying a first voltage greater than the lower threshold voltage and less than the upper threshold voltage to the first electrode of the selector device, wherein the selector device is in a high resistance state in response thereto and a first charge is maintained on the gate of the MOS transistor.

At 904, the method can include applying a second voltage greater than the upper threshold voltage to the first electrode of the selector device, wherein the selector device enters a low resistance state in response thereto and a second charge accumulates on the gate of the MOS transistor.

At 906, the method can include applying a third voltage greater than the lower threshold voltage and less than the upper threshold voltage to the first electrode of the selector device, wherein the selector device enters the high resistance state in response thereto and at least a portion of the second charge is maintained on the gate of the MOS transistor, wherein the portion of the second charge is greater than the first charge.

In one or more further embodiments, removing the second positive voltage can further comprise removing an applied voltage from the first terminal of the capacitor structure. In another embodiment, a ratio of high resistance state to the low resistance state is within a range of approximately 10E7:1 to approximately 10E10:1; or a range of approximately 10E9:1 to approximately 10E11:1. According to alternative or additional embodiments, the first positive threshold can be within a range of about 1.25 to about 1.5 volts, and the second positive threshold can be within a range of about 1.5 volts to about 1.8 volts. In one or more further embodiments, a difference between the first positive threshold voltage and the second positive threshold voltage can be within a range of about 0.1 volts. In still other embodiments, method 900 can further comprise, following removing the second positive voltage from the first terminal of the capacitor: applying a positive read voltage to the source of the MOS transistor, wherein the positive read voltage is less than the second positive threshold voltage; coupling ground to the drain of the MOS transistor; and sensing a read current flow from the source to the drain in response to the positive read voltage, wherein the read current is associated with a state of the memory circuit.

According to one or more other embodiments, method 900 can additionally comprise applying a first negative voltage to the first terminal of the capacitor structure, wherein when the first negative voltage is less than a first negative threshold voltage, the selector device is in a low resistance state, at least some of a first charge accumulated upon the gate of the MOS transistor is dissipated, and a second charge is accumulated upon the gate of the MOS transistor. Further, method 900 can comprise removing the first negative voltage from the first terminal of the capacitor structure to cause the selector device to be in the high resistance state and to cause the second charge to be maintained accumulated upon the gate of the MOS transistor. In one or more other embodiments, the first negative threshold voltage is within a range of about −1.5 volts to about −1.8 volts. In still other embodiments, after removing the first negative voltage from the first terminal of the capacitor, method 900 can additionally comprise: applying the read voltage to the source of the MOS transistor; connecting ground to the drain of the MOS transistor; and sensing a read current from the source to the drain in response to the read voltage, wherein the read current is associated with a state of the memory circuit.

Example Operating Environments

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 10 and 11, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. These or similar considerations can be addressed by some or all of the disclosed aspects.

Figure 10:
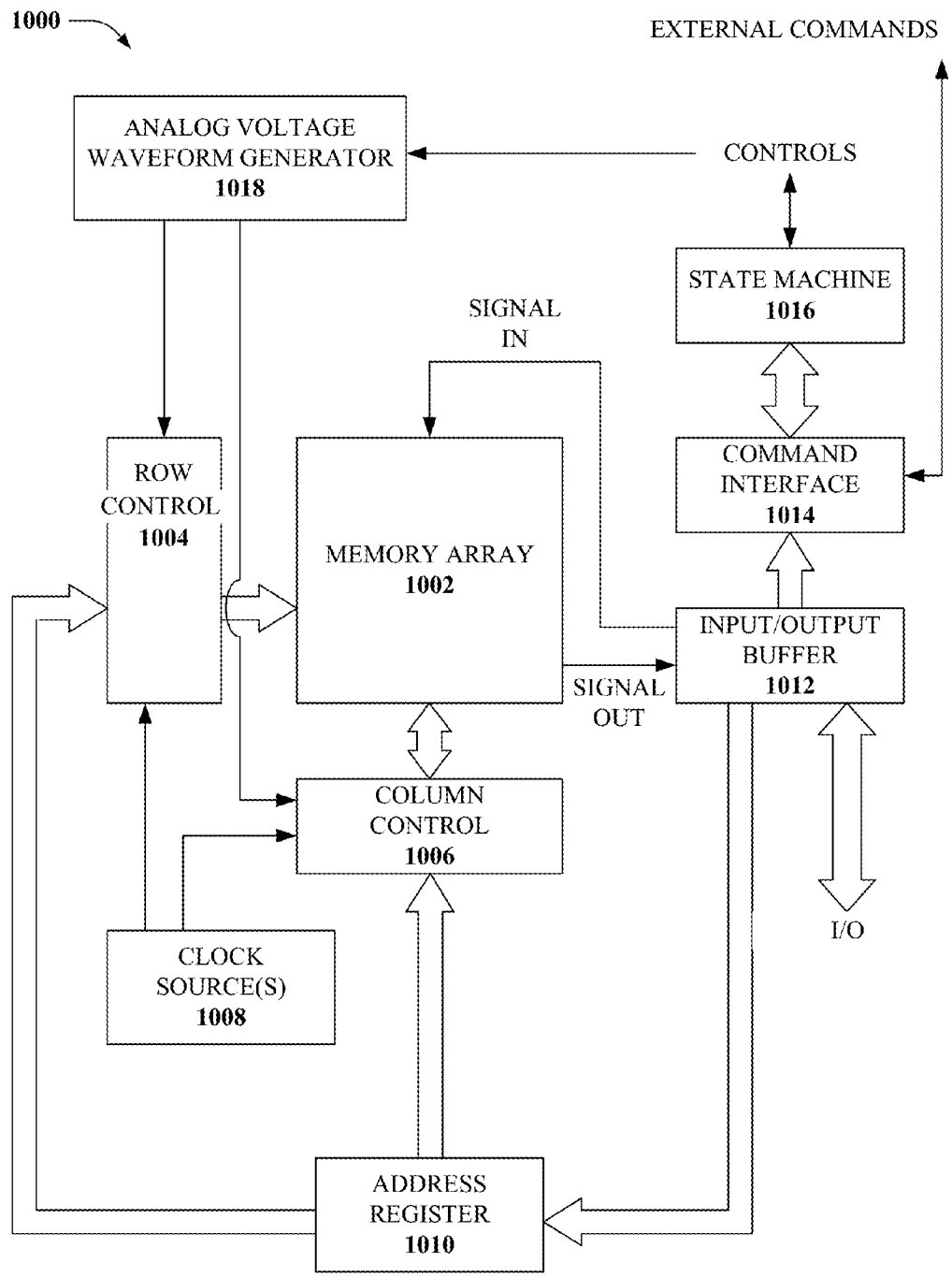
FIG. 10 depicts a block diagram of a sample operating environment for facilitating implementation of one or more aspects disclosed herein.

In order to provide a context for the various aspects of the disclosed subject matter, FIG. 10, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 10 illustrates a block diagram of an example operating and control environment 1000 for a memory cell array 1002 according to aspects of the subject disclosure. In at least one aspect of the subject disclosure, memory cell array 1002 can comprise a variety of memory cell technology. Particularly, memory cell array 1002 can comprise two-terminal memory such as resistive memory cells with a resistive switching medium formed via ion implantation to a conductive polysilicon material, as described herein.

A column controller 1006 can be formed adjacent to memory cell array 1002. Moreover, column controller 1006 can be electrically coupled with bit lines of memory cell array 1002. Column controller 1006 can control respective bitlines, applying suitable program, erase or read voltages to selected bitlines.

In addition, operating and control environment 1000 can comprise a row controller 1004. Row controller 1004 can be formed adjacent to column controller 1006, and electrically connected with word lines of memory cell array 1002. Row controller 1004 can select particular rows of memory cells with a suitable selection voltage. Moreover, row controller 1004 can facilitate program, erase or read operations by applying suitable voltages at selected word lines.

A clock source(s) 1008 can provide respective clock pulses to facilitate timing for read, write, and program operations of row control 1004 and column control 1006. Clock source(s) 1008 can further facilitate selection of word lines or bit lines in response to external or internal commands received by operating and control environment 1000. An input/output buffer 1012 can be connected to an external host apparatus, such as a computer or other processing device (not depicted) by way of an I/O buffer or other I/O communication interface. Input/output buffer 1012 can be configured to receive write data, receive an erase instruction, output readout data, and receive address data and command data, as well as address data for respective instructions. Address data can be transferred to row controller 1004 and column controller 1006 by an address register 1010. In addition, input data is transmitted to memory cell array 1002 via signal input lines, and output data is received from memory cell array 1002 via signal output lines. Input data can be received from the host apparatus, and output data can be delivered to the host apparatus via the I/O buffer.

Commands received from the host apparatus can be provided to a command interface 1014. Command interface 1014 can be configured to receive external control signals from the host apparatus, and determine whether data input to the input/output buffer 1012 is write data, a command, or an address. Input commands can be transferred to a state machine 1016.

State machine 1016 can be configured to manage programming and reprogramming of memory cell array 1002. State machine 1016 receives commands from the host apparatus via input/output interface 1012 and command interface 1014, and manages read, write, erase, data input, data output, and like functionality associated with memory cell array 1002. In some aspects, state machine 1016 can send and receive acknowledgments and negative acknowledgments regarding successful receipt or execution of various commands.

In an embodiment, state machine 1016 can control an analog voltage waveform generator 1018 that provides read/write and program/erase signals to row control 1004 and column control 1006.

To implement read, write, erase, input, output, etc., functionality, state machine 1016 can control clock source(s) 1008. Control of clock source(s) 1008 can cause output pulses configured to facilitate row controller 1004 and column controller 1006 implementing the particular functionality. Output pulses can be transferred to selected bit lines by column controller 1006, for instance, or word lines by row controller 1004, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 11, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 11:
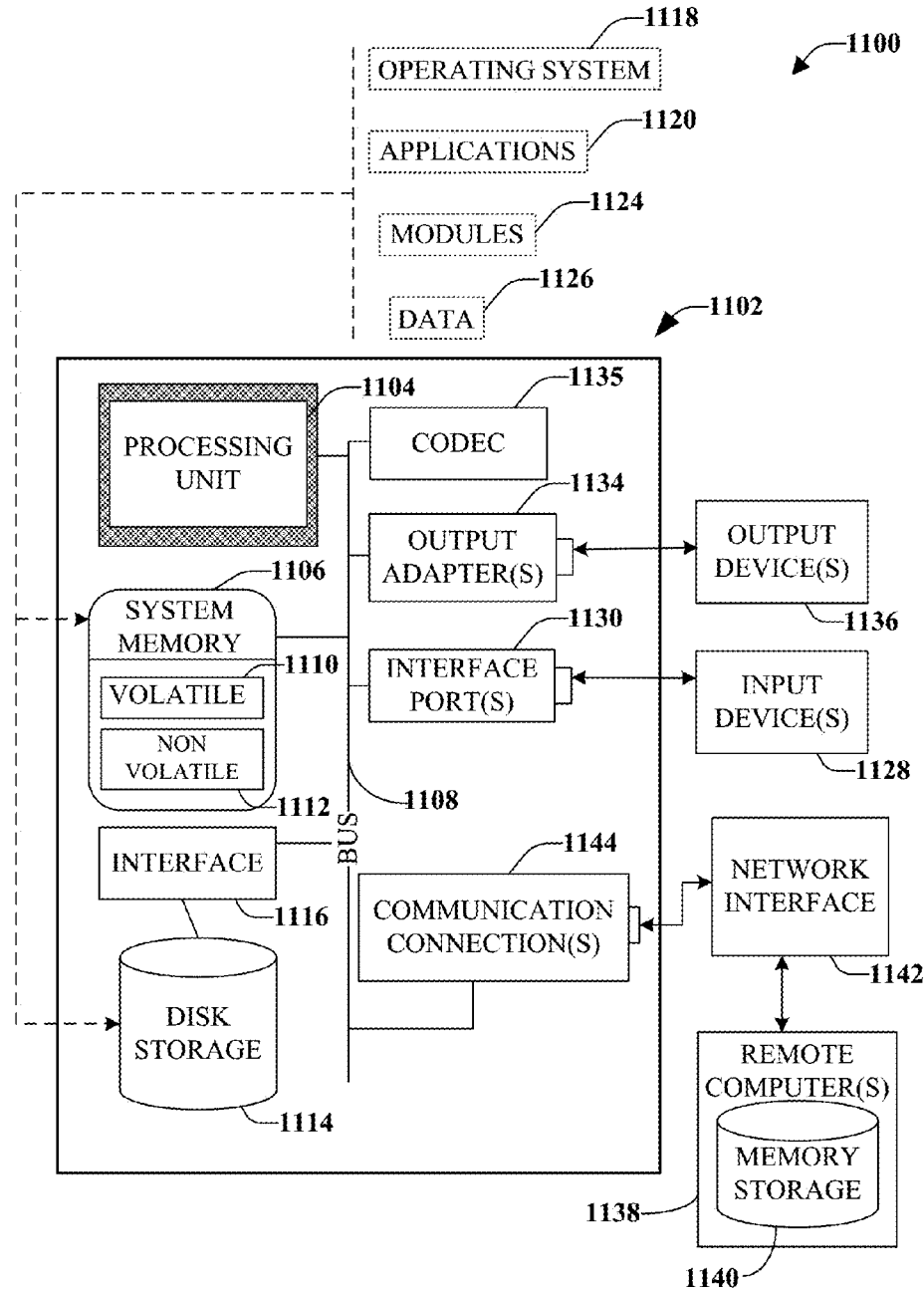
FIG. 11 illustrates a block diagram of an example computing environment that can be implemented in conjunction with various embodiments.

With reference to FIG. 11, a suitable environment 1100 for implementing various aspects of the claimed subject matter includes a computer 1102. The computer 1102 includes a processing unit 1104, a system memory 1106, a codec 1135, and a system bus 1108. The system bus 1108 couples system components including, but not limited to, the system memory 1106 to the processing unit 1104. The processing unit 1104 can be any of various available processors. Dual microprocessors and other multiprocessor architectures also can be employed as the processing unit 1104.

The system bus 1108 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1106 includes volatile memory 1110 and non-volatile memory 1112, which can employ one or more of the disclosed memory architectures, in various embodiments. The basic input/output system (BIOS), containing the basic routines to transfer information between elements within the computer 1102, such as during start-up, is stored in non-volatile memory 1112. In addition, according to present innovations, codec 1135 may include at least one of an encoder or decoder, wherein the at least one of an encoder or decoder may consist of hardware, software, or a combination of hardware and software. Although, codec 1135 is depicted as a separate component, codec 1135 may be contained within non-volatile memory 1112. By way of illustration, and not limitation, non-volatile memory 1112 can include read only memory (ROM), programmable ROM (PROM), electrically programmable ROM (EPROM), electrically erasable programmable ROM (EEPROM), or Flash memory. Non-volatile memory 1112 can employ one or more of the disclosed memory devices, in at least some embodiments. Moreover, non-volatile memory 1112 can be computer memory (e.g., physically integrated with computer 1102 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1110 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1102 may also include removable/non-removable, volatile/non-volatile computer storage medium. FIG. 11 illustrates, for example, disk storage 1114. Disk storage 1114 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1114 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1114 to the system bus 1108, a removable or non-removable interface is typically used, such as interface 1116. It is appreciated that storage devices 1114 can store information related to a user. Such information might be stored at or provided to a server or to an application running on a user device. In one embodiment, the user can be notified (e.g., by way of output device(s) 1136) of the types of information that are stored to disk storage 1114 or transmitted to the server or application. The user can be provided the opportunity to opt-in or opt-out of having such information collected or shared with the server or application (e.g., by way of input from input device(s) 1128).

It is to be appreciated that FIG. 11 describes software that acts as an intermediary between users and the basic computer resources described in the suitable operating environment 1100. Such software includes an operating system 1118. Operating system 1118, which can be stored on disk storage 1114, acts to control and allocate resources of the computer system 1102. Applications 1120 take advantage of the management of resources by operating system 1118 through program modules 1124, and program data 1126, such as the boot/shutdown transaction table and the like, stored either in system memory 1106 or on disk storage 1114. It is to be appreciated that the claimed subject matter can be implemented with various operating systems or combinations of operating systems.

A user enters commands or information into the computer 1102 through input device(s) 1128. Input devices 1128 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1104 through the system bus 1108 via interface port(s) 1130. Interface port(s) 1130 include, for example, a serial port, a parallel port, a game port, and a universal serial bus (USB). Output device(s) 1136 use some of the same type of ports as input device(s) 1128. Thus, for example, a USB port may be used to provide input to computer 1102 and to output information from computer 1102 to an output device 1136. Output adapter 1134 is provided to illustrate that there are some output devices 1136 like monitors, speakers, and printers, among other output devices 1136, which require special adapters. The output adapters 1134 include, by way of illustration and not limitation, video and sound cards that provide a means of connection between the output device 1136 and the system bus 1108. It should be noted that other devices or systems of devices provide both input and output capabilities such as remote computer(s) 1138.

Computer 1102 can operate in a networked environment using logical connections to one or more remote computers, such as remote computer(s) 1138. The remote computer(s) 1138 can be a personal computer, a server, a router, a network PC, a workstation, a microprocessor based appliance, a peer device, a smart phone, a tablet, or other network node, and typically includes many of the elements described relative to computer 1102. For purposes of brevity, only a memory storage device 1140 is illustrated with remote computer(s) 1138. Remote computer(s) 1138 is logically connected to computer 1102 through a network interface 1142 and then connected via communication connection(s) 1144. Network interface 1142 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1144 refers to the hardware/software employed to connect the network interface 1142 to the bus 1108. While communication connection 1144 is shown for illustrative clarity inside computer 1102, it can also be external to computer 1102. The hardware/software necessary for connection to the network interface 1142 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

In various embodiments, the voltages applied to the memory device were illustrated to be linear. In other embodiments, the voltages may be non-linear, step-type functions, or the like.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for operating a memory circuit comprising a capacitor structure, a selector device, and a MOS transistor, wherein the capacitor structure comprises a first terminal and a second terminal, the selector device comprises a first electrode connected to the second terminal, wherein the selector device is associated with an upper threshold voltage and a lower threshold voltage, and a second electrode connected to a gate of the MOS transistor and the MOS transistor also includes a source and a drain, the method comprising:
   applying a first voltage greater than the lower threshold voltage and less than the upper threshold voltage to the first electrode of the selector device, wherein the selector device is in a high resistance state in response thereto and a first charge is maintained on the gate of the MOS transistor;
   applying a second voltage greater than the upper threshold voltage to the first electrode of the selector device, wherein the selector device enters a low resistance state in response thereto and a second charge accumulates on the gate of the MOS transistor; and thereafter
   applying a third voltage greater than the lower threshold voltage and less than the upper threshold voltage to the first electrode of the selector device, wherein the selector device enters the high resistance state in response thereto and at least a portion of the second charge is maintained on the gate of the MOS transistor, wherein the portion of the second charge is greater than the first charge.

2. The method of claim 1, wherein applying the third voltage comprises decreasing a voltage applied to the first electrode of the selector device to ground.

3. The method of claim 1,
   wherein applying the first voltage comprises applying a fourth voltage to the first terminal of the capacitor structure, wherein the fourth voltage is within a range of about zero volts to less than about 3 volts; and
   wherein applying the second voltage comprises applying a fifth voltage to the first terminal of the capacitor structure, wherein the fifth voltage is within a range of greater than about 3 volts to about 4 volts.

4. The method of claim 1, further comprising:
applying a read voltage to the source of the MOS transistor;
coupling ground to the drain of the MOS transistor; and
sensing a first read current flow from the source to the drain in response to the read voltage, wherein the first read current is associated with an amount of charge maintained on the gate of the MOS transistor.

5. The method of claim 4
wherein a first state of the memory circuit is associated with the first charge maintained on the gate of the MOS transistor; and
wherein a second state of the memory circuit is associated with the portion of the second charge maintained on the gate of the MOS transistor.

6. The method of claim 1, further comprising:
applying a fourth voltage less than the lower threshold voltage to the first electrode of the selector device, wherein the selector device enters the low resistance state, wherein some of the portion of the second charge dissipates from the gate of the MOS transistor, and wherein a third charge is maintained on the gate of the MOS transistor in response thereto; and
applying a fifth voltage greater than the lower threshold voltage and less than the upper threshold voltage to the first electrode of the selector device, wherein the selector device enters the high resistance state in response thereto and at least a portion of the third charge is maintained on the gate of the MOS transistor, wherein the portion of the third charge is less than the portion of the second charge.

7. The method of claim 1,
wherein the first voltage and the third voltage are ground;
wherein applying the second voltage comprises linearly increasing a voltage applied to the first electrode of the selector device from ground to the second voltage.

8. A memory device comprising:
a capacitor structure comprising a first terminal and a second terminal, wherein the first terminal is configured as a first terminal of the memory device and is configured to receive a plurality of input voltages;
a selector device comprising a first electrode and a second electrode, wherein the first electrode is coupled to the second terminal of the capacitor, wherein the selector device is characterized by a high resistance state when a first voltage is applied across the first electrode and the second electrode, wherein the first voltage is greater than a negative threshold voltage and less than a positive threshold voltage, and wherein the selector device is characterized by a low resistance state when a second voltage is applied across the first electrode and the second electrode, wherein the second voltage greater than the positive threshold voltage; and
a MOS transistor coupled to the selector device, wherein the MOS transistor comprises a gate coupled to the second electrode of the selector device, a source and a drain, wherein the MOS transistor is characterized by a high-conductivity state or a low-conductivity state in response to a magnitude of charge stored on the gate.

9. The memory device of claim 8, wherein a ratio of the high resistance state of the selector device compared to the low resistance state of the selector device is within a range of about $1\times10^9$:1 to about $1\times10^{11}$:1.

10. The memory device of claim 8, further comprising at least one additional MOS transistor coupled to the source or the drain of the MOS transistor, wherein the one additional MOS transistor is configured to electrically couple or electrically decouple the memory device from other memory devices in a memory array.

11. The memory device of claim 8, wherein the positive threshold voltage is within a range of about 0.5 volts to about 1.7 volts.

12. The memory device of claim 8,
wherein the second voltage greater than the positive threshold voltage or lower than a negative threshold voltage; and
wherein the negative threshold voltage is within a range of about −0.3 volts to about −1.7 volt.

13. The memory device of claim 11,
wherein the second voltage is applied across the first electrode and the second electrode of the selector device in response to a voltage applied to the first terminal of the memory device; and
wherein the voltage is within a range of about 3.5 volts to about 4.5 volts.

14. The memory device of claim 8 wherein the selector device comprises:
the first electrode comprising a first metal material;
a layer of selector material in contact with the first electrode;
the second electrode in contact with the layer of the selector material and comprising a second metal material;
wherein the first metal material is configured to provide conductive ions to the selector material in response to a voltage greater than the positive threshold voltage being applied across the first layer electrode and the second electrode,
wherein the selector material is configured to allow the conductive ions to permeate within the layer of selector material in response to the voltage greater than the positive threshold voltage being applied across the first electrode and the second electrode.

15. A circuit, comprising:
a voltage source configured to provide a programming voltage, an erase voltage, and a read voltage;
a capacitor structure coupled to the voltage source, wherein the capacitor structure comprises a first terminal coupled to the voltage source and a second terminal;
a selector device coupled to the capacitor structure, wherein the selector device comprises a first electrode coupled to the second terminal of the capacitor and a second electrode, wherein the selector device is configured to be in a low resistance state in response to a first voltage being applied to the first terminal of the capacitor structure, wherein the first voltage comprises the programming voltage and the erase voltage, and wherein the selector device is configured to be in a high resistance state in response to the read voltage being applied to the first terminal of the capacitor structure; and
a MOS transistor connected to the selector device, wherein the MOS transistor comprises a source, a drain, a channel between the source and drain, and a gate coupled to the second electrode of the selector device, wherein the gate is configured to accumulate a first charge in response to the programming voltage being applied to the first terminal of capacitor structure, wherein the gate is configured to accumulate a second charge in response to the erase voltage being applied to the first terminal of the capacitor structure, and wherein the gate is configured to maintain accumulation of a charge accumulated on the gate in response to the read voltage being applied to the first terminal of the capacitor structure, wherein the channel between the source and the drain is in a conductive state when the gate maintains accumulation of the first charge, and wherein the channel between the source and drain is in a non-conductive state when the gate maintains accumulation of the second charge, wherein the first charge is larger than the second charge.

16. The circuit of claim 15, wherein resistances of the high resistance state and the low resistance state have a ratio within a range of about $1\times10^9$:1 and $1\times10^{11}$:1.

17. The circuit of claim 15, further comprising a current sensor coupled to the source of the MOS transistor, wherein the current sensor is configured to determine whether the channel between the source and the drain is in the conductive state or the non-conductive state.

18. The circuit of claim 15,
wherein the programming voltage comprises a first voltage greater than a first positive voltage, and
wherein the erase voltage comprises a second voltage lower than a first negative voltage.

19. The circuit of claim 18, wherein the read voltage is greater than the first negative voltage and lower than the first positive voltage.

20. The circuit of claim 18, wherein the first positive voltage is within a range of about 3 volts to about 5 volts.

21. The circuit of claim 15, wherein a resistance of the high resistance state is greater than 1 GΩ.

22. The circuit of claim 15, further comprising;
a second MOS transistor connected to the MOS transistor, wherein the second MOS transistor comprises a second source, a second drain, and a second gate, wherein the second source or the second drain of the second MOS transistor is coupled to the drain or the source, respectively, of the MOS transistor;
a crossbar array comprising a plurality of bit lines, a plurality of word lines, and a plurality of enable lines, wherein the first terminal of the capacitor structure is coupled to the voltage source via a word line, wherein the gate of the second MOS transistor is coupled to an enable line, and wherein a drain of the second MOS transistor is coupled to a bit line; and
a sensing circuit coupled to the crossbar array, wherein the source of the MOS transistor is coupled to an input of the sensing circuit.

23. The circuit of claim 15, wherein the circuit is scaled below 20 nm technology.

24. The circuit of claim 15, wherein circuit is formed by back to back-end-of-line metal layers of a semiconductor chip.

25. The circuit of claim 15 wherein the selector device comprises:
the first electrode comprising a first metal material;
a layer of selector material in contact with the first electrode;
the second electrode in contact with the layer of the selector material and comprising a second metal material;
wherein the first metal material is configured to provide conductive ions to the selector material in response to a voltage greater than the positive threshold voltage being applied across the first layer electrode and the second electrode,
wherein the selector material is configured to allow the conductive ions to permeate within the layer of selector material in response to the voltage greater than the positive threshold voltage being applied across the first electrode and the second electrode.

26. The memory device of claim 14, wherein the first metal material is selected from a group consisting of: a noble metal, a noble metal alloy and a noble metal compound.

27. The memory device of claim 14, wherein the first metal material is selected from a group consisting of: Ag, Pd, Pt, Au, Ag—Al, Ag—Pd—Cu, Ag—W, Ag—Ti, Ag—TiN and Ag—TaN.

* * * * *